United States Patent [19]

Wittlinger

[11] 4,429,283

[45] Jan. 31, 1984

[54] DIFFERENTIAL CURRENT AMPLIFIER

[75] Inventor: Harold A. Wittlinger, Pennington, N.J.

[73] Assignee: RCA Corporation, New York, N.Y.

[21] Appl. No.: 320,434

[22] Filed: Nov. 12, 1981

[51] Int. Cl.³ .............................................. H03F 3/45
[52] U.S. Cl. .................................... 330/257; 330/253; 330/254; 330/259; 330/260
[58] Field of Search ............... 330/253, 254, 257, 259, 330/260, 288

[56] References Cited

U.S. PATENT DOCUMENTS

| 3,260,947 | 7/1966 | Dorsman | 330/17 |
| 3,688,209 | 8/1972 | Winkel | 330/257 X |
| 3,697,882 | 10/1972 | Van Den Plassche | 330/15 |
| 3,717,821 | 2/1973 | Amemiya et al. | 330/26 |
| 4,055,812 | 10/1977 | Rosenthal | 330/253 |

FOREIGN PATENT DOCUMENTS 1513024  6/1978  United Kingdom .

OTHER PUBLICATIONS

J. I. Smith, *Modern Operational Circuit Design*, Wiley-Interscience, N. Y. (1971) pp. 127–129.
J. G. Graeme et al., *Operational Amplifiers, Design and Applications*, 1971, McGraw-Hill, pp. 232–233.

Primary Examiner—James B. Mullins
Attorney, Agent, or Firm—E. M. Whitacre; J. S. Tripoli; E. P. Herrmann

[57] ABSTRACT

A differential current amplifier includes a differential input transistor pair having respective first and second unity gain current mirror amplifiers (CMA) connected in their respective output circuits. The output terminal of the CMA connected in the output circuit of the first transistor of the differential pair is connected to the input terminal of the second transistor of the differential pair. The output terminal of the CMA connected in the output circuit of the second transistor is connected to the input terminal of the first transistor. The current feedback to the input terminals of the differential pair conditions them to be responsive to input signal currents. An amplifier output current can be derived from an additional current output from one of the first and second CMA's, the additional CMA output having a gain of A relative to the unity gain output.

10 Claims, 3 Drawing Figures

DIFFERENTIAL CURRENT AMPLIFIER

This invention relates to current amplifier circuits and more particularly to current amplifiers having a differential current input.

Current trends in circuit design show increasing emphasis on low voltage and battery powered systems. Many of these systems are coupled with measuring transducers which have large dynamic ranges. Typically the output signal from such transducers has been amplified by conventional operational amplifiers which produce a voltage signal gain. The use of low voltage supplies however tends to limit the realizable dynamic range of voltage amplifiers. This phenomena results from the necessity of maintaining the output transistors within particular bias limits in order to insure linear operation. This may readily be appreciated by considering a push-pull output stage. In order for the transistors of a push pull stage to operate in their linear regions the output potential excursion must generally be limited to a threshold (or $V_{be}$) voltage from the respective supply potential. If the threshold potential of the transistors is 0.7 volts the maximum output potential swing is equal to the supply voltage less 1.4 volts. An amplifier powered by a 5 volt supply and having a 5 millivolt input offset potential will have a dynamic range limited to approximately 700. This is insufficient to realize the full dynamic range of many signal transducers.

On the other hand the dynamic range of current amplifiers such as current mirrors do not suffer a loss in dynamic range arising from low voltage supply operation. The gain of a current mirror is established by a simple geometric ratio between an input (master) and an output (slave) transistor. The dynamic range is limited only by the available supply current which generally is not a function of the supply potential. Therefore, it is advantageous in low voltage amplifiers to develop signal amplification in a current rather than a voltage mode.

SUMMARY OF THE INVENTION

The present current amplifier comprises first and second field effect transistors (FETs) having their source electrodes connected to a common node. A programmable or variable current source supplies current to the common node and thereby to the FET source electrodes. First and second current mirror amplifiers (CMA's) have their input connections respectively connected in the drain circuits of the FET transistors. The CMA connected in the drain circuit of the first FET has a first current output connected to the input or gate electrode of the second FET. The CMA connected in the drain circuit of the second FET has a first current output connected to the input or gate electrode of the first FET.

A second current output of the first CMA is connected to the input connection of a third CMA. The output connection of the third CMA is interconnected with a second current output connection of the second CMA to form a current output terminal for the amplifier.

DETAILED DESCRIPTION

Figure 1:
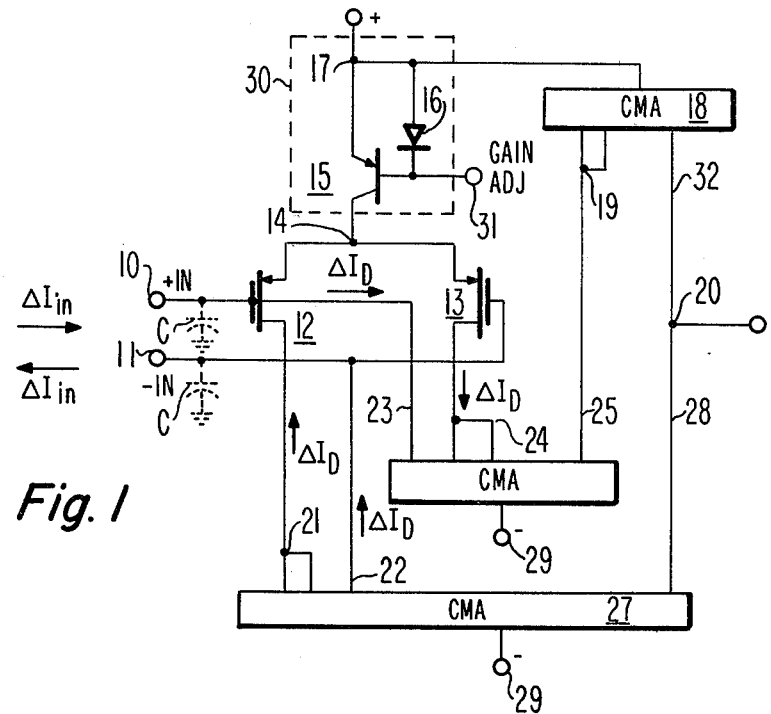
FIGS. 1, 2 and 3 are schematic diagrams of three current amplifiers embodying the present invention.

Referring first to FIG. 1 first (12) and second (13) P-type field effect transistors having respective source electrodes connected at node 14 are arranged as a conventional differential amplifier circuit with bias current provided to their common connection 14 by an adjustable current source 30. Input signal current is applied to the gate electrodes of transistors 12, and 13 at terminals 10 and 11 respectively. The output or drain electrode of transistor 12 is connected to an input terminal 21 of a first current mirror amplifier (CMA) 27 having first and second signal current output terminals 22 and 28. The output or drain electrode of transistor 13 is connected to an input terminal 24 of a second current mirror amplifier 26 having first and second signal current output terminals 23 and 25. The second signal current output terminal of CMA 26 is connected to an input terminal 19 of a third CMA 18 having a signal output terminal 32 which is connected to the second output terminal 28 of CMA 27 at terminal 20. The interconnection 20 of the output terminals of CMA 18 and CMA 27 provides a push-pull output signal current. It should be noted however that a single ended current output can be taken directly from either of the output terminals 28 or 25. CMA's 26, 27 and 18 provide signal currents at their respective output terminals which are proportional to the signal currents applied to their respective input terminals. Typically the current gain of the CMA output signal is a simple function of the geometric dimensions of the active elements therein and thus can be designed with a high degree of accuracy. In the circuit of FIG. 1 the first current output 23 of CMA 26 is designed with a gain of unity. Similarly the first current output 22 of CMA 27 is designed with a gain of unity. It should be recognized that the current gain at output terminals 22, and 23 need not be unity but may have a value greater or lesser than unity. For balanced operation however the gain exhibited at the two terminals should be equal. For illustrative purposes it will be assumed that the second current outputs 25 and 28 of CMA's 26 and 27 have like gains of A and the gain of CMA 18 is unity.

The differential connection of transistors 12 and 13 results in changes in their respective drain circuits being complementary. An increase $\Delta I$ in the drain current of transistor 12 is reflected as an equal and opposite drain current change $(-) \Delta I$ in transistor 13. These current changes generate amplified currents of $A\Delta I$ at terminal 25 of CMA 26 and $(-)A\Delta I$ at terminal 28 of CMA 27. The current $A\Delta I$ at terminal 25 produces an output current $(-)A\Delta I$ at terminal 32 of CMA 18. The gain realized at terminal 20 is thus 2A relative to current changes in the drain current changes of transistors 12 and 13, and relative to the current changes at the unity output terminals of CMA's 26 and 27.

In order that the amplifier input terminals be current responsive the unity output terminal of CMA 27 is connected to input terminal 11 and the unity output terminal 23 of CMA 26 is connected to input terminal 10. In a typical application further current sources or resistors must be applied to input terminals 10 and 11 to provide D.C. bias current for the bias current which would normally be output by the unity output connections of CMA's 26 and 27. Consider differential input current signal $\Delta I_{in}$ applied to terminals 10 and 11. Consider also that there is associated with each input terminal a stray capacitance C. Summing currents at terminal 10

$$\Delta I_{in} - \Delta I_D - \Delta I_C = 0 \quad (1)$$

where $\Delta I_{in}$ is the input signal current, $\Delta I_D$ is the change in the drain current of transistor 13 reflected in the unity output terminal 23 of CMA 26 and $\Delta I_C$ is the current charging the stray capacitance C.

$$\Delta I_D = K \text{ gm } \Delta V_{in} \quad (2)$$

where K is a constant, gm is the transconductance of transistor 13 (or 12) and $\Delta V_{in}$ is the change in capacitor potential due to the charging current $\Delta I_C$.

$$\Delta V_{in} = \Delta I_C \Delta t/C = I_C 2\pi/\omega C \quad (3)$$

$\Delta t$ is the charging period and $\omega$ is the angular frequency related to $\Delta t$. Combining equations (1), (2) and (3) the current gain realized at the CMA unity output terminal $\Delta I_D/\Delta I_{in}$ can be shown to be, $$\Delta I_D/\Delta_{in} = 1/(1 + \omega C/2\pi K gm). \quad (4)$$

The amplifier response is that of a current follower with a 3db roll off at the frequency equal to Kgm/C. The overall gain of the amplifier is equal to 2A, i.e. the relative gain at the output terminal 20 relative to the gain at the unity output terminals of the CMA's 26 and 27.

The input impedance, $Z_{in}$ looking into terminal 10 can be shown to be $$Z_{in} = (1/Kgm)/(1 = \omega C/2\pi K gm) \quad (5)$$

which is small for transistors having a large gm.

The transconductance of a field effect transistor is related to the source-drain current of the transistor. The variable current source 30 provides a means for adjusting the drain-source current of transistors 12 and 13 and thereby their transconductance. It also provides a means for disabling the gain of the amplifier by cutting off the drain current entirely or reducing the drain current to reduce gm, thereby increasing the input impedance and lowering effective gain of the circuit.

Variable current source 30 has an input control terminal 31. An input control current applied to terminal 31 is reflected in the collector circuit of transistor 15. Transistor 15 and diode 16 are arranged in a current mirror configuration well known in the art of current amplifiers and will not be described further here.

CMA's 26 and 27 were generally characterized as having fixed current gain. It should be appreciated however that these amplifiers may be configured to have switchable gain characteristics. For example the slave or output portion of the CMA may comprise a plurality of transistors of size X, relative to the input device, which may be selectively connected in parallel by a switch means. If only one of these slave transistors is connected in the circuit the CMA will exhibit a gain of X. If 10 slave transistors are connected in parallel by appropriate switch means the CMA will exhibit a gain of 10X etc. Such switchable gain CMA's are also known in the CMA arts see for example U.S. Pat. No. 4,064,506.

The differential configuration illustrated which comprises transistors 12 and 13 may be substituted by any of the more complex differential circuit configurations known in the art which have a common node for applying bias current, first and second differential input terminals and first and second differential current output terminals. For example, transistors 12 and 13 may be replaced by respective pnp bipolar darlington transistor combinations wherein the common emitter terminal of each darlington is connected to terminal 14, the respective base input connections of the respective darlingtons are connected to input terminals 10 and 11 and the respective collector output terminals of the darlingtons are connected to the input terminals 21 and 24 of CMA's 27 and 26 respectively.

Certain systems may require that a particular transducer be sensed in a single ended manner and that the transducer be biased at a particular potential. Under these conditions it is advantageous not to apply current feedback to one input terminal of the differential circuit but rather to apply a reference potential source thereto. With reference to FIG. 1 this implies connecting the particular single ended transducer to input terminal 11 for example, disconnecting the CMA 26 output connection 23 from input terminal 10 and connecting a source of the desired potential to terminal 10. By virtue of the current feedback to terminal 11, the potential applied to terminal 10 will be translated to terminal 11, and the amplifier input characteristics will appear to be those of a current amplifier.

Figure 2:
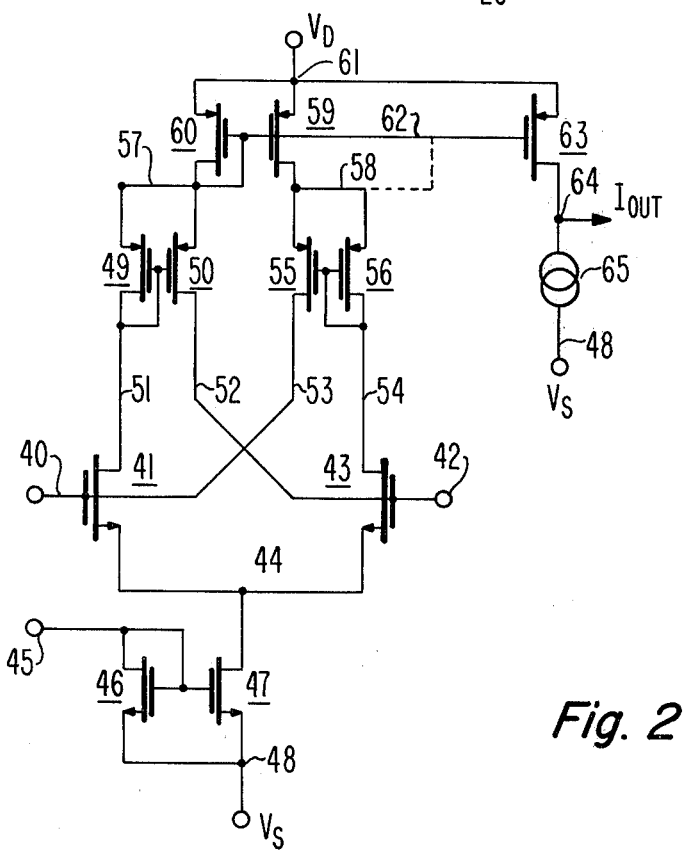

FIG. 2 is a current amplifier having an input stage similar to that of the FIG. 1 circuit, but realized with all field effect transistors. In the circuit transistors 41 and 43 are arranged in a differential pair configuration with current supplied to their source electrodes by the variable current source comprising transistors 46 and 47. The source electrode current is controlled by current applied to control electrode 45.

A first unity gain CMA including transistors 49 and 50 has its input terminal connected to the drain electrode of transistor 41 and its output terminal connected to the gate electrode of transistor 43 at amplifier input terminal 42. A second unity gain CMA including transistors 55 and 56 has its input terminal connected in series with the drain electrode of transistor 43 and its output terminal connected to the gate electrode of transistor 41 at the amplifier input terminal 40. The first and second CMA's configure the differential input transistors 41 and 43 to be responsive to input signal currents.

The common terminal 57 of the first CMA is applied to the input terminal of a third CMA comprising transistor 60 and 59. The output terminal of the third CMA is connected to the common terminal 58 of the second CMA. The gain of the third CMA is unity so that equal bias currents flow in the drain circuits of transistors 41 and 43 to minimize input offset conditions.

The first and second CMA's connected in the drain electrodes of transistors 41 and 43 do not contribute to the overall amplifier gain. In fact, the first and second CMA's limit the current gain at the drain electrodes of transistors 41 and 43 to unity. As a result the input signal current to the third CMA is unity with respect to the current input signal at terminals 40 and 42.

The overall amplifier gain is realized by virtue of transistor 63 having its gate and source electrodes connected in parallel with the third CMA input transistor 60. This configures transistor 63 as a further CMA output transistor with transistor 60 as the input. The output current supplied by transistor 63 is related to the input current to transistor 60 in proportion to the ratio of the transconductance of transistors 63 to the transconductance of transistor 60. For transistors 60 and 63 integral to the same semiconductor substrate the transconductance of the two devices can be related to their drain-source channel geometries permitting the design of an accurate gain value. Thus, if the relative sizes of transistors 63 and 60 are 10:1 respectively the current gain of the amplifier is 10.

Alternatively, the gate of transistor 63 may be connected to the output connection of the third CMA at connection 58. The differential stage has a current gain of 2 at this point. However, the voltage gain at connection 58 is high—equal to $(2\Delta I_{in}R)$ where R is substantially the equivalent resistance of the output drain impedance of transistor 59 in parallel with the output drain impedance of transistor 43. The signal output current is then given by $(2gm\Delta I_{in}R)$ where gm is the transconductance of transistor 63. The current gain of the amplifier is 2gmR which can be relatively large.

Figure 3:
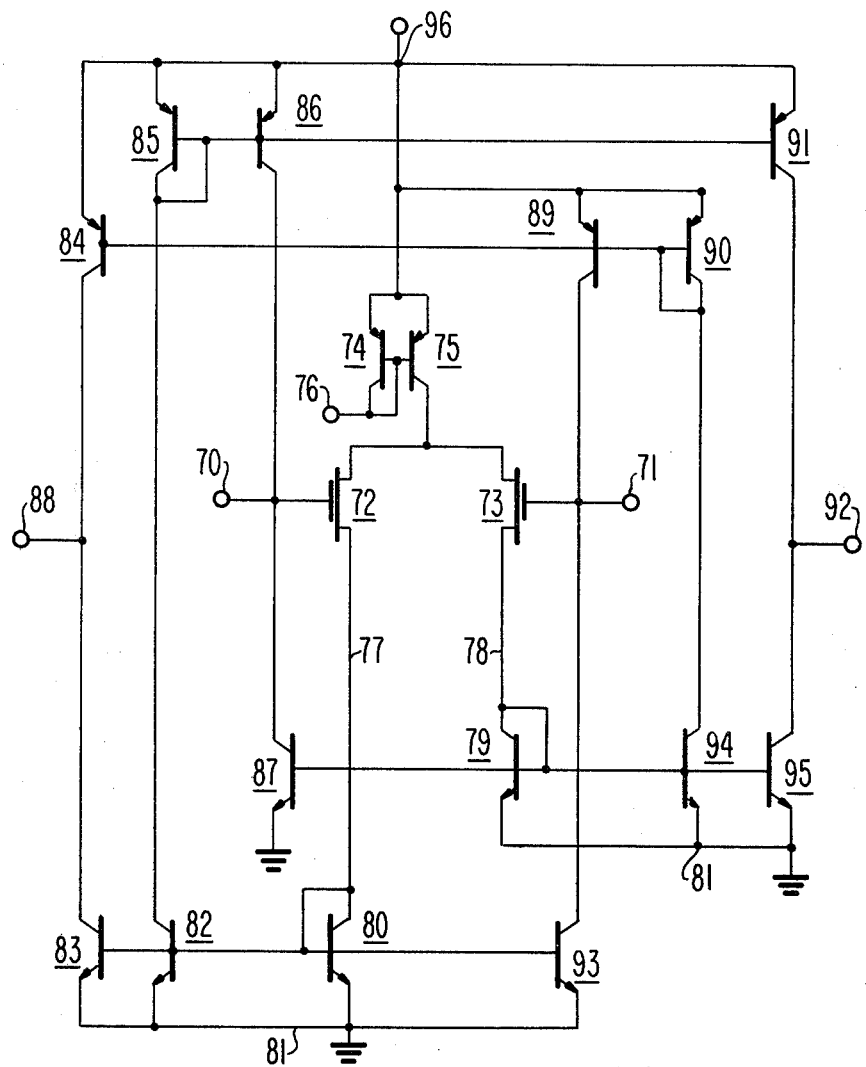

FIG. 3 shows a further embodiment wherein the CMA's connected in the drain electrodes of the input differential pair transistors 72 and 73, are interconnected with further CMA's to provide push-pull feedback current to the amplifier input terminals 70 and 71 and to provide complementary push pull current output signals. Translating the single ended CMA output signals described in the foregoing with respect to FIG. 1, to push pull output signals as shown in FIG. 3 is known in the current amplifier arts and will not be described in detail. One transistor scaling arrangement will be set forth for illustrative purposes. A gain of 2A and (−)2A will be available at terminals 88 and 92 for transistors 79, 80, 82, 85, 86, 87, 89, 90, 93 and 94 all having dimensions of one unit and transistors 83, 84, 91 and 95 having dimensions of A units.

I claim :

1. A current amplifier comprising:
a current bias source;
a differential input circuit having a common terminal, first and second differential input terminals and first and second differential current output terminals, wherein output signal at said second output terminal is in phase with signal applied to said first differential input terminal;
means connecting the current bias source to said common terminal;
a first current mirror amplifier having an input terminal and an output terminal;
a second current mirror amplifier having an input terminal, a first output terminal exhibiting a current gain equivalent to said first current mirror amplifier and a second current output terminal having a current gain A;
respective means for connecting the input terminals of the first and second current mirror amplifiers to the first and second differential current output terminals respectively; and
respective means for connecting the output and first output terminals of the first and second current mirror amplifiers directly to the second and first differential input terminals respectively.

2. The current amplifier set forth in claim 1 further including means to selectively vary the bias current provided by said current bias source.

3. The current amplifier set forth in claim 1 or 2 wherein the differential input circuit comprises;
first and second similar transistors having respective first and second electrodes and a principal conduction path therebetween, and having respective control electrodes, current in the respective principal conduction paths being controlled by signal applied between the respective control and first electrodes;
means for connecting the respective first electrodes to the common terminal;
respective means for connecting the control electrodes of the first and second transistors to the first and second differential input terminals respectively; and
respective means for connecting the second electrodes of the first and second transistors to the first and second differential output current terminals respectively.

4. The current amplifier set forth in claim 1 or 2 wherein the first current mirror amplifier further includes a second current output terminal having a current gain A; and wherein said current amplifier further includes:
a third current mirror amplifier having an input terminal and a unity gain output terminal; and
respective means for connecting the input and output terminals of the third current mirror amplifier to the second output terminals of said second and first current mirror amplifiers respectively.

5. A current amplifier comprising:
a bias current source;
first and second like transistors having input, output and common electrodes, said common electrodes interconnected at a common terminal to configure said first and second transistors as a differential pair;
means for connecting said bias current source for providing bias current to said common terminal;
third, fourth, fifth and sixth like transistors having respective input, output and common electrodes and being a conductivity type complementary to said first and second transistors;
means for connecting the common electrodes of the third and fourth transistors;
means for connecting the common electrodes of the fifth and sixth transistors;
means for providing respective operating currents to the common electrodes of the third and fourth transistors and to the common electrodes of the fifth and sixth transistors;
means for connecting the output electrode of the first transistor to the input electrodes of the third and fourth transistors;
means for connecting the output electrode of the second transistor to the input electrodes of the fifth and sixth transistors;
respective means for connecting the output electrodes of the third and fifth transistors to the output electrodes of the first and second transistors respectively;
respective means for connecting the output electrodes of the fourth and sixth transistors directly to the input electrodes of the second and first transistors respectively.

6. The current amplifier set forth in claim 5 wherein the means for providing operating currents comprises:
seventh and eighth like transistors having input, output, and common electrodes and being of similar conductivity type as said third transistor;
means for connecting the common electrodes of said seventh and eighth transistor to a source of supply potential;
means for connecting the input electrodes of the seventh and eighth transistors to the common electrodes of the third and fourth transistors; and
respective means for connecting the output electrodes of the seventh and eighth transistors respectively to the interconnection of the common electrodes of the third and fourth transistor and the interconnection of the common electrodes of the fifth and sixth transistors.

7. The current amplifier set forth in claim 6 further including:
a ninth transistor having input, output and common electrodes and being of the same conductivity type as the seventh transistor, the transconductance of the seventh and ninth transistors being in the ratio 1:A;
means for interconnecting the common electrodes of the seventh and ninth transistors;
means for interconnecting the input electrodes of the seventh and ninth transistors; and
means for providing operating current to the output electrode of said ninth transistor and wherein output signal from said current amplifier is available at the output electrode of said ninth transistor.

8. The current amplifier set forth in claim 6 further including:
a ninth transistor having input, output and common electrodes and being of the same conductivity type as the seventh transistor;
means for interconnecting the common electrodes of the seventh and ninth transistors;
means for connecting the input electrode of the ninth transistor to the output electrode of the eighth transistor; and wherein signal output current from said current amplifier is available from the output electrode of the ninth transistor.

9. A current amplifier comprising:
a current bias source;
a differential input circuit having a common terminal, first and second differential input terminals and first and second differential current output terminals, wherein output signal at said second output terminal is in phase with signal applied to said first differential input terminal;
means connecting the current bias source to said common terminal;
a first CMA having an input and first, second and third output terminals;
a second CMA having an input and first and second output terminals;
a third CMA having an input and first output terminal;
a fourth CMA having an input and first and second output terminals;
respective means for connecting the input terminals of the first and second CMA's to the first and second differential current output terminals respectively;
means for connecting the second output terminal of the second CMA to the input terminal of the fourth CMA;
means for connecting the second output terminal of the first CMA to the input terminal of the third CMA;
means for connecting the first output terminals of the first and fourth CMA's, to the second differential input terminal;
means for connecting the first output terminals of the second and third CMA's to the first differential input terminal; and
means for connecting the third output terminal of the first CMA to the second output terminal of the fourth CMA to form an output terminal for said current amplifier.

10. A current amplifier comprising:
a current bias source;
a signal input terminal and a signal output terminal;
a differential input circuit having a common terminal, first and second differential input terminals and first and second differential current output terminals, wherein output signal at said second ouput terminal is in phase with signal applied to said first differential input terminal;
means connecting the current bias source to said common terminal;
a first current mirror amplifier having an input terminal and an output terminal;
a second current mirror amplifier having an input terminal and an output terminal exhibiting a gain of A relative to the gain of said first current mirror amplifier;
respective means for connecting the input terminals of the first and second current mirror amplifiers to the first and second differential output current terminals respectively;
means for connecting the output terminal of the first current mirror amplifier directly to the signal input terminal;
means for connecting said second differential input terminal to said signal input terminal; and
means for connecting said second current mirror amplifier output terminal to said signal output terminal.

* * * * *